United States Patent [19]

Herwig et al.

[11] Patent Number: 4,485,166

[45] Date of Patent: Nov. 27, 1984

[54] RADIATION-POLYMERIZABLE MIXTURE AND PHOTOPOLYMERIZABLE COPYING MATERIAL PREPARED THEREFROM

[75] Inventors: Walter Herwig, Bad Soden; Rudolf Decker, Bodenheim; Helga Sikora, Wiesbaden; Kurt Erbes, Floersheim, all of Fed. Rep. of Germany

[73] Assignee: Hoechst Aktiengesellschaft, Frankfurt am Main, Fed. Rep. of Germany

[21] Appl. No.: 366,379

[22] Filed: Apr. 7, 1982

[30] Foreign Application Priority Data

Apr. 13, 1981 [DE] Fed. Rep. of Germany ....... 3114931

[51] Int. Cl.$^3$ .......................... G03C 1/68; G03C 1/76
[52] U.S. Cl. .................................... 430/260; 430/258; 430/280; 430/287; 430/292; 204/159.15
[58] Field of Search ............... 430/280, 281, 285, 286, 430/288, 910, 258, 260, 292; 204/159.15, 159.23

[56] References Cited

U.S. PATENT DOCUMENTS

| | | | |
|---|---|---|---|
| 3,661,576 | 5/1972 | Crary | 430/288 |
| 3,776,729 | 12/1973 | Levy et al. | 430/280 |
| 3,804,631 | 4/1974 | Faust | 96/115 |
| 3,876,432 | 4/1975 | Carlick et al. | 430/288 |
| 3,930,865 | 1/1976 | Faust et al. | 96/86 P |
| 4,025,348 | 5/1977 | Tsukada et al. | 430/280 |
| 4,065,315 | 12/1977 | Yamazaki | 430/281 X |
| 4,146,453 | 3/1979 | Via | 204/159.15 |
| 4,227,978 | 10/1980 | Barton | 430/286 |
| 4,230,793 | 10/1980 | Losert et al. | |
| 4,234,675 | 11/1980 | Kuznetsov | 430/280 |
| 4,241,166 | 12/1980 | Klüpfel et al. | 430/962 |
| 4,248,958 | 2/1981 | Faust | 430/281 X |
| 4,271,258 | 6/1981 | Watariguchi | 430/284 |
| 4,278,752 | 7/1981 | Gervay et al. | |
| 4,346,163 | 8/1982 | Takeyama et al. | |
| 4,387,139 | 6/1983 | Herwig et al. | 428/423.7 |

FOREIGN PATENT DOCUMENTS

| | | | |
|---|---|---|---|
| 15004 | 2/1980 | European Pat. Off. | |
| 2841880 | 4/1980 | Fed. Rep. of Germany | |
| 56-100817 | 8/1981 | Japan | 204/159.19 |
| 1484873 | 9/1977 | United Kingdom | |
| 900244 | 1/1982 | U.S.S.R. | 430/286 |

OTHER PUBLICATIONS

W. J. Roff et al. (Ed.), *Handbook of Common Polymers*, (Butterworth & Co. (Publishers) Ltd., 1971), p. 273.

*Primary Examiner*—John E. Kittle
*Assistant Examiner*—Cynthia Hamilton
*Attorney, Agent, or Firm*—Schwartz, Jeffery, Schwaab, Mack, Blumenthal & Koch

[57] ABSTRACT

A radiation-polymerizable mixture comprising a compound having at least two terminal ethylenically unsaturated groups which can form a crosslinked polymer by means of free-radical initiated addition polymerization, a polymeric binder, a radiation activatable polymerization initiator, and a compound having two epoxy groups in the molecule and a molecular weight of not more than 1,500; and a photopolymerizable copying material having a flexible transparent temporary support and a transferrable thermoplastic photopolymerizable layer comprising the above-described radiation-polymerizable mixture.

31 Claims, No Drawings

RADIATION-POLYMERIZABLE MIXTURE AND PHOTOPOLYMERIZABLE COPYING MATERIAL PREPARED THEREFROM

BACKGROUND OF THE INVENTION

The present invention relates to a radiation-polymerizable mixture comprising as essential constituents (a) a compound having at least two terminal ethylenically unsaturated groups which can form a crosslinked polymer by means of free-radical initiated chain addition polymerization (b) a polymeric binder and (c) a radiation-activatable polymerization initiator. The radiation-polymerizable mixture of the invention is particularly useful as a dry film for the production of solder masks.

Single-faced, double-faced and especially through-hole plated printed circuit boards are provided with a solder mask before they are soldered. The application of such masks leaves only soldering pads exposed, whereby tin is conserved during soldering. In addition, during the soldering process some of the soldering heat is kept away from the workpiece so that heat-sensitive components, with which the printed circuit boards are equipped, are not damaged during the soldering. Last but not least, solder masks have the important function of covering all those areas of the circuit diagram which must not come into contact with the solder in order to avoid the possibility of forming conducting bridges between individual conducting paths, which are fatal for a circuit system.

To satisfy these quite complex requirements, various processes and various forms of products have been used in the past.

From the foregoing, it is clear that solder masks must have a pattern which is oriented according to the given conducting paths. One widely used technique is to apply solder masks by screen printing. It is also possible by means of screen printing to apply masks which have a relatively high layer thickness, thereby ensuring that the conducting paths are thoroughly embedded and well shielded.

Masks produced by screen printing processes are inherently limited by the nature of the screen printing process. When the distances between conducting paths are reduced, the relatively coarse image structures of screen printing are no longer adequate to protect the extremely fine circuit patterns of the latest microconductor technology.

In recent years solder masks have therefore been produced to an increasing extent by photoresist techniques. As in the production of printed circuits, thermoplastic photopolymerizable layers are laminated by pressure and heat to the printed circuit board and cured by imagewise exposure at those places where the printed circuit board is to be covered. The solder mask is then obtained by washing away the unexposed parts of the thermoplastic layer. This process makes possible higher image resolutions than the screen printing process.

Materials of this type are described in German Offenlegungsschrift No. 2,747,947. They comprise photopolymerizable layers which contain a certain amount of bonded halogen to improve their flame-resistance. Published European Application No. 15,004 describes a similar material which can be developed dry by mechanically separating exposed and unexposed layer areas ("peel-apart process"). Finally, published European Application No. 2,040 describes a light-curable material for the same purpose in which the light-sensitive compounds are identified as light-sensitive epoxy resins but are not described in more detail.

Photopolymerizable mixtures known and used for producing photoresist masks are transferred dry and with heating onto the printed circuit board to be masked. They must, therefore, necessarily be thermoplastic. However, for use as solder masks this thermoplasticity is disadvantageous since the masks must withstand temperatures above 200° C. without decomposition and without melting or even softening to too high a degree. Admittedly, the photopolymer layer is hardened to a considerable extent in the exposed areas by crosslinking polymerization. The initial light-hardening can be further enhanced in a known way by re-exposure of the developed image stencil. However, the basic tendency of all known photopolymerizable layers to soften when heated remains.

SUMMARY OF THE INVENTION

Accordingly, it is the object of the present invention to provide an improved photopolymerizable mixture.

Another object of the present invention is to provide a photopolymerizable mixture suitable for producing photoresist layers useful as solder masks.

A further object of the present invention is to provide a photopolymerizable mixture which can be applied to printed circuit boards in sufficiently thick layers to satisfactorily shield the conductive paths of the printed circuit.

It is also an object of the present invention to provide a photopolymerizable mixture capable of producing photoresists which exhibit high image resolution.

Additionally, it is an object of the present invention to provide a photopolymerizable mixture which can be used to provide protection for extremely fine printed circuit patterns.

Yet another object of the present invention is to provide an improved photopolymerizable mixture which can be used to produce dry transferrable photoresist layers.

An additional object of the present invention is to provide a photopolymerizable mixture which will produce films which in the unexposed state are sufficiently thermoplastic for lamination to printed circuit boards by means of heat and pressure.

A still further object of the present invention is to provide a photopolymerizable mixture capable of forming photoresist films which do not exhibit excessive thermoplasticity after exposure and development.

Still another object of the present invention is to provide a photopolymerizable mixture which can be used to produce photoresist solder masks capable of withstanding temperatures above 200° C. in the exposed and developed state.

These and other objects of the invention are achieved by providing a radiation-polymerizable mixture comprising (a) a compound having at least two terminal ethylenically unsaturated groups which can form a crosslinked polymer by free-radical initiated chain addition polymerization, (b) a polymeric binder, (c) a radiation-activatable polymerization initiator, and (d) a compound having two epoxy groups in the molecule and a molecular weight of not more than 1,500. Preferably, the molecular weight of the epoxy group containing compound will be less than 1,000.

DETAILED DESCRIPTION OF PREFERRED EMBODIMENTS

Any form of electromagnetic radiation having sufficient energy to activate a suitable polymerization initiator may be used as an actinic radiation to which the mixture of the invention is sensitive. Particularly suitable for this purpose are visible and ultraviolet light, X-ray, gamma and electron radiation. Laser radiation in the visible and in the ultraviolet regions can also be used. Short-wave visible and near ultraviolet light are preferred.

Particularly suitable bis-epoxides include bis-glycidyl ethers of dihydric alcohols and phenols such as bisphenol A, of polyethylene glycol and polypropylene glycol ethers of bisphenol A, of butane-1,4-diol, hexane-1,6-diol, polyethylene glycol, polypropylene glycol or polytetrahydrofuran. Bis-glycidyl ethers of trihydric alcohols, such as glycerol, can also be used. The bis-epoxides are usually added to the mixture in an amount from about 1.5 to about 10, preferably from about 2 to about 6 weight percent relative to the non-volatile constituents of the mixture.

Bis-epoxides are preferably used which correspond to the general formula

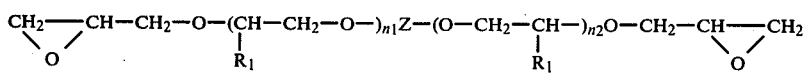

in which z represents an alkylene or hydroxyalkylene group having 2 to 6 carbon atoms or a group corresponding to the formula

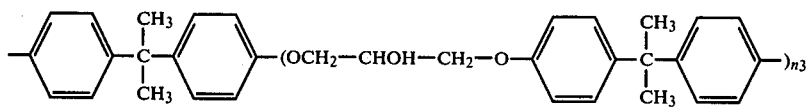

$R_1$ represents a hydrogen atom or a methyl group, $n_1$ and $n_2$ each represent a number from 0 to 10, preferably from 0 to 5, and $n_3$ represents a number from 0 to 4, preferably 0 or 1.

The polymerizable compounds generally are esters of acrylic acid or of methacrylic acid with polyhydric, preferably primary, alcohols. The alcohol should contain from 2 to about 4 hydroxyl groups, since the desired crosslinking action is achieved by polyunsaturated compounds. The mixture may also contain minor quantities of esters of monohydric alcohols or of alcohols which have more than 4 hydroxyl groups. Suitable polyhydric alcohols include ethylene glycol, propylene glycol, butane-1,4-diol, butane-1,3-diol, diethylene glycol, triethylene glycol, polyethylene glycols having molecular weights from about 200 to 1000, neopentylglycol, trimethylolethane, trimethylolpropane, pentaerythritol and bisphenol A bis-hydroxyethyl ether.

Low-molecular weight bis-acrylates and bis-methacrylates containing urethane groups obtained by reacting 2 moles of a hydroxyalkyl acrylate or hydroxylalkyl methacrylate with 1 mole of an aliphatic or cycloaliphatic diisocyanate, such as 2,2,4-trimethylhexamethylene diisocyanate, are also suitable. Monomers containing such urethane groups are described in U.S. Pat. No. 4,088,498.

Mixtures of various monomers may be advantageously used. It has proved particularly suitable to combine monomers of the aforementioned type with high-molecular weight monomers containing urethane groups which correspond to the general formula

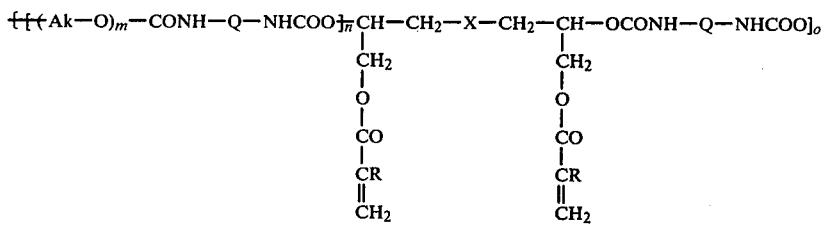

in which Q represents a bivalent mononuclear or binuclear aromatic radical which is unsubstituted or substituted by lower alkyl groups and which can contain a lower alkylene group as a connecting member, X represents one of the groups —O—Ph—X'—Ph—O—, and —OOC—(CH$_2$)$_y$—COO—, in which Ph represents an optionally substituted phenylene group, X' represents an alkylene group having 1-4 carbon atoms and y represents a number from 2 to 12, R represents a hydrogen atom or a methyl group, Ak represents an alkylene radical having from 2 to 4 carbon atoms, m represents a number from 4 to 50, n represents a number from 1 to 6 and o represents a number from 4 to 20.

These polyether ester urethanes are prepared in a known manner by reacting oligomeric diisocyanates corresponding to the formula

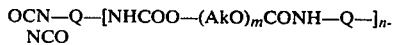

with bis-acrylate diols corresponding to the formula

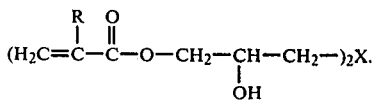

The preparation and use of these compounds is described in German Patent Application P 30 36 694.

These polyurethanes generally have reduced specific viscosities (RSV), of about 0.15 to 1.4 dl/g, measured with 1% strength solutions in dimethylformamide at 25° C. Products having RSV values within the range from 0.2 to 0.9 dl/g are preferred.

Preferred average values are 8–20 for m, 2–4 for n, 5–12 for o and 2–6 for y.

X' represents an alkylene group in which the free valencies are preferably located at one C atom. Particularly preferred groups include methylene, 1,1-ethylene and 2,2-propylene groups. R preferably represents a methyl group.

The total proportion of polymerizable compounds generally comprises from 20 to 50, preferably from 25 to 45, weight percent relative to the non-volatile constituents of the mixture. Of this amount from 2 to 20, preferably from 5 to 10, weight percent relative to the non-volatile constituents of the mixture, can be composed of polyurethanes corresponding to the general formula given above.

The mixtures of the invention also contain a polymeric, preferably saturated, binder. Water-insoluble binders which are soluble or at least swellable in aqueous-alkaline solutions are preferred. The binders may contain, as groups which impart solubility in alkali, phosphonic acid, sulfonic acid, sulfonamide, carboxylic anhydride and preferably carboxyl groups. Preferred binders are mixed polymers of methacrylic acid and alkyl methacrylates and, if desired, also styrene or other comonomers, as described in German Offenlegungsschriften Nos. 2,064,080 and 2,363,806. The binders generally comprise from 40 to 80, preferably from 50 to 70, weight percent relative to the non-volatile constituents of the mixture.

A large number of substances can be used as photoinitiators in the mixture of the invention. Examples include acridine derivatives such as 9-phenylacridine, 9-p-methoxyphenylacridine, 9-acetylaminoacridine or benzo(a)acridine; phenazine derivatives such as 9,10-dimethylbenzo(a)phenazine, 9-methylbenzo(a)phenazine or 10-methoxybenzo(a)phenazine; quinoxaline derivatives such as 6,4',4''-trimethoxy-2,3-diphenylquinoxaline or 4',4''-dimethoxy-2,3-diphenyl-5-azaquinoxaline; and quinazoline derivatives. The acridine, phenazine and quinoxaline derivatives are preferred. The photoinitiators are generally used in an amount of from 0.01 to 10, preferably from 0.05 to 2 weight percent of the mixture.

The mixture of the invention also preferably contains at least one dyestuff to make the developed resist stencil more visible. For this purpose a combination of at least two dyestuffs is advantageously used, at least one of which changes its color on irradiation and is destroyed at temperatures above 200° C., i.e., becomes colorless. The other dyestuff should be able to survive not only irradiation but also temperatures above 200° C. without change. It should make the solder mask clearly visible during soldering and thereafter.

Suitable examples of dyestuffs which change color on exposure include triphenylmethane dyestuffs and certain azo dyestuffs, as described in U.S. Pat. No. 4,241,166.

Suitable light- and heat-resistant dyestuffs include oxazolone dyestuffs such as a dyestuff corresponding to the formula

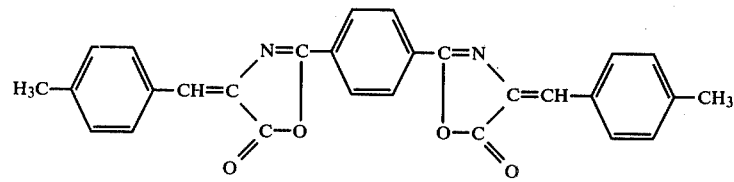

or anthraquinone dyestuffs such as 1,4-bis-(4-tert.-butoxy-phenylamino)-5,8-dihydroxy anthraquinone.

Mixtures according to the invention may also contain, in addition to monomers, binders, photoinitiators and dyestuffs, other customary additives such as inhibitors for preventing the thermal polymerization of the monomers, hydrogen donors, sensitometric regulators, pigments and plasticizers.

The mixture of the invention can be processed by known techniques to give a dry resist material. In general a solvent solution of the mixture is applied to a suitable support, such as a polyester film, and dried. The layer thickness of the resist layer may range from about 10 to 150, preferably from 20 to 120, μm. The free surface of the resist layer is preferably covered with a covering film, for example a film of polyethylene or polypropylene. The finished laminate can be stored in the form of a full width roll which can be cut as needed into resist rolls of any desired width.

The films can be processed using the equipment customarily used to process dry resists. In a commercially available laminating device the covering film is pulled off and the solder mask layer is laminated onto the printed circuit board which is to be protected and which has been provided, for example, with metallized bores. The thus prepared board is exposed through an original which protects from irradiation those parts of the board which must be left free for the soldering process.

After being freed from the support film, the resist film is developed in a known manner. Suitable developers comprise aqueous, preferably aqueous-alkaline solutions, such as solutions of alkali metal phosphates, alkali metal carbonates or alkali metal silicates, to which, if desired, small amounts, for example up to 10 weight percent, of wetting agents or water-miscible organic solvents may be added.

Fully prepared printed circuit boards, covered or masked by the process steps just described, must then be subjected to a heat treatment before the soldering process. It is believed that in this treatment, parts of the binder react with the epoxide to give an interlaced network which is responsible for the good mechanical, thermal and chemical properties of the solder masks. This thermal treatment is generally carried out at a temperature from 80° C. to 150° C. for approximate treatment times of 10 to 40 minutes.

The heat-treated board, which is ready for soldering, may be equipped with electronic components, the connectors of which are bent across the appropriate conductive paths of the circuit board in those areas which are bared in the developing process.

The conducting side of the board can then be treated with a suitable, commercially available soldering flux and subjected to flow soldering in a commercially available flow soldering machine.

Useful soldering fluxes include known eutectic mixtures which permit soldering temperatures of about 230° C. to 260° C. One known mixture contains, for example, 63 weight percent tin and 37 weight percent lead.

The solder masks of the present invention can also be used successfully in processes in which double-faced, through-hole plated printed circuit boards are soldered by immersion in liquid metal baths.

The mixtures of the invention produce solder mask layers which are distinguished by a high flexibility and mechanical strength in the unexposed and exposed state and by a high heat resistance in the exposed and post-cured state. In combination with the preferred photoinitiators, the photopolymerizable layers have a high sensitivity to light, and a satisfactory curing or crosslinking throughout the layer is obtained even in thick layers. Even when the thickness is above 100 μm, the exposed layers can be developed acceptably and completely using aqueous-alkaline solutions.

The exposed and developed layers can be thermally cured without excessively impairing the flexibility of the mask or its adhesion to the support and without altering the position and dimensions of the areas bared by developing. The cured masks are resistant to atmospheric, thermal and chemical influences for relatively long time periods. After exposure of the resist layer, a high-contrast image is already obtained in the layer. The light-cured mask retains its high-contrast coloration even after the soldering. Solder masks produced from the mixtures of the invention are particularly suitable for protecting sensitive electronic conductor structures from atmospheric attack in an effective and permanent manner.

The following examples illustrate particular embodiments of the invention. Unless otherwise indicated parts, percentages and quantity ratios are expressed in terms of weight. Parts by weight are related to parts by volume as grams are related to milliliters.

EXAMPLE 1

A solution was prepared from:

| | |
|---|---|
| 26 | parts terpolymer formed from n-hexyl methacrylate, methacrylic acid and styrene (60:30:10), having an average molecular weight of about 35,000 and an acid number of 195, |
| 12.8 | parts polyethylene glycol 400 dimethacrylate, |
| 3.2 | parts of the elastomer described below, |
| 1.2 | parts 2,2-bis-(4-glycidoxy-phenyl)-propane, |
| 0.2 | part 9-phenyl-acridine, |
| 0.02 | part 2,4,6-trinitro-2'-acetylamino-4'-diethylamino-5'-methyl-azobenzene and |
| 0.06 | part 1,4-bis-(4-tert.-butoxy-phenyl-amino)-anthraquinone in |
| 107.5 | parts butanone and |
| 6.0 | parts ethanol. |

The elastomer used was prepared as follows:

A. In a 1 liter four-necked flask, equipped with a stirrer, a thermometer, a reflux condenser and a drying tube, 426 parts by weight of glycidyl methacrylate and 216 parts by weight of adipic acid were mixed by stirring, and the mixture was carefully heated to an internal temperature of 80° C. after the addition of 19.7 parts p-methoxy-phenol and 6.4 parts benzyl-triethylammonium chloride. After about 2 hours a clear solution was obtained which was maintained at 80° C. for a further 14 hours. After this time the content of free glycidyl methacrylate was less than 0.5%.

B. 143 parts of an oligomeric diisocyanate corresponding to the formula

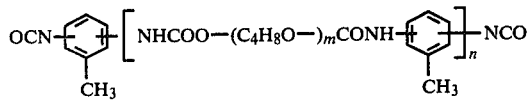

having an average molecular weight of about 2,000 and an isocyanate group content of 4.1% by weight (Adiprene L 100), dissolved in 300 parts by volume of methyl ethyl ketone, were placed into a 1 liter four-necked flask equipped with a stirrer, thermometer, dropping funnel, condenser and drying tube, and there was added 0.87 part benzoquinone and 0.85 part by volume of a solution prepared by dissolving 6.3 parts iron(III) acetylacetonate and 0.45 part triethylamine in methyl ethyl ketone and adding methyl ethyl ketone to 100 parts by volume. A solution of 31.33 parts of the reaction product obtained in accordance with the procedure described above in Section A in 300 parts by volume of methyl ethyl ketone was poured into the dropping funnel and added dropwise over the course of 40 minutes to the solution in the flask which was heated at 70° C. and stirred. After two hours further stirring at 30° C., 10 parts by volume of ethanol were added to the clear reaction mixture. Distilling the solvent from the viscous solution produced a non-tacky, rubber-like mass which gave clear solutions in numerous organic solvents, such as tetrahydrofuran, acetone or toluene. The reduced specific viscosity of the product was 0.72 dl/g (measured with a 1% strength solution in dimethylformamide at 25° C.).

A 110 cm wide web of biaxially stretched and heat-set 25 μm thick polyethylene terephthalate film was coated in a continuous manner with a solution of this composition by means of a slot die. After passing through a drying zone, the resist layer had a thickness of 70 μm. The resist layer was then covered with a polypropylene film. The resulting dry resist film was stored on a full width roll. The full width roll was then cut with a roll cutter into manageably sized resist rolls having a width of 45 cm and a web length of 50 m. By selecting an optimal winding tension it was ensured that successive layers of the roll were positioned evenly on the support core and that the roll did not slide off laterally, i.e., did not telescope.

Even after months of storage at 20° C., the cut edges of these rolls were unchanged and completely free of resist outflows which lead to sticking. The cut edges were still tack-free after storage for more than three weeks at 40° C. in a drying cabinet.

Epoxy resin glass fabrics 24×36 cm in size backed with a 35 μm thick copper foil were used in the laminating experiments. A conductor diagram having conducting path widths of at least 200 μm and separations between conducting paths of at least 180 μm was produced on these boards in a known manner by exposure using a commercially available negative dry resist and an exposure mask featuring a circuit diagram. After developing, the bared conducting paths were reinforced by a two-stage electroplating process:

1. 40 minutes in a copper electrolyte bath from Messrs. Schloetter, Geislingen/Steige, of the "Bright copper bath" type
Current density 2.5 A/dm$^2$
Metal coating about 20 μm
2. 15 minutes in a lead tin bath from Messrs. Schloetter, Geislingen/Steige, "LA" type
Current density 1.0 A/dm$^2$
Metal coating 10 μm After stripping off the photoresist stencil and etching away the base copper, test boards referred to below as "Sn boards", were obtained having approximately 65 μm thick conducting paths with a tinned surface.

In a further experiment boards were produced on which only the additional copper reinforcement was carried out and then the base copper was etched away. Such boards are referred to below as "Cu boards".

The 70 μm thick solder mask layer was laminated onto these boards at 120° C. using a commercially available laminating device.

The boards were then exposed through an exposure original which covered the soldering points and holes to be soldered for 12 seconds using a commercially available exposure device having a 5 kW metal halide light and thereafter developed in a commercially available spray processor for 2 minutes with a 0.8% strength sodium carbonate solution and blown dry. The resulting printed circuit boards were then cured for 20 minutes at 120° C. in a drying cabinet. After subsequent cooling, the boards were wetted with the water-soluble soldering flux ALPHA 709 from Messrs. Alpha Grillo and then passed at a speed of 0.25 m/min through a commercially available flow soldering bath at 240° C.

This process produced boards having a dust-dry, highly impact-resistant and scratch-resistant surface. Even narrow conducting paths were tightly shielded by the cured solder mask layer, and ground sections showed neither defects nor inclusions of air at the upper or lower edges of the conducting paths.

Wrinkled surfaces ("orange peels") formed on the solder masks on the Sn boards, due to fusion of the tin surface during soldering. However, even in these cases a perfectly safe and acceptable adhesion of the solder mask was obtained.

The Cu boards were treated as follows:

The laminating, exposing, developing and aftercuring steps were carried out in the same way as above. The bared holes of the printed circuit boards were then provided with a thin lead-tin layer using the so-called hot-air leveling process. In this hot-air leveling or in hot tinning, the printed circuit boards were immersed in a hot lead-tin bath at 250° C. and blown dry with hot air at the same temperature as they were withdrawn from the bath. Any of the holes which may have been blocked were thereby blown open. A wafer-thin lead-tin layer remained in and around the holes as a protection against corrosion. The solder mask showed no adverse effects after this treatment.

EXAMPLE 2

The solution described in Example 1 was used in an analogous manner to produce a 100 μm thick resist layer. The photoresist layer was laminated onto printed circuit boards, exposed, developed and aftercured. The resulting boards did not have wrinkly surfaces after soldering.

EXAMPLE 3

The procedure described in Example 1 was followed except 3.2 parts of the elastomer described below were used instead of the elastomer used in Example 1. The resulting light-sensitive solution was used to produce a dry resist film as in Example 1, and the film was then laminated, exposed and developed. In all these processing steps virtually the same results were obtained as in Example 1. The elastomeric polyurethane used was prepared as follows:

Into a 1 liter three-necked flask equipped with a thermometer, dropping funnel, condenser, drying tube, and magnetic stirrer were introduced 177 parts of the oligomeric diisocyanate described in Section B. of Example 1 in 250 parts by volume of methyl ethyl ketone together with 1 part 1,4-benzoquinone, 0.05 part iron(III) acetylacetonate and 2 parts by volume of a 1% strength solution of triethylamine in methyl ethyl ketone.

After this solution had been heated to 60° C., a solution of 45.3 parts of commercially available 2,2-bis-[4-(2-methacryloyloxypropoxy)-phenyl]-propane (calculated C: 67.97%, observed C: 67.9%; calculated H: 7.03, observed H: 7.1; calculated OH number: 219, observed OH number: 216; calculated Br number: 62.5, observed Br number: 65) in 150 parts by volume of methyl ethyl ketone was added dropwise over the course of 30 minutes. The reaction product was maintained for 2 hours at 65° to 70° C., and 5 parts by volume of alcohol were then added. After the solvent had been distilled off, a dry, elastic rubber was obtained which was soluble in and recoverable from solutions of methyl ethyl ketone and other organic solvents, such as toluene and tetrahydrofuran. The product had a reduced specific viscosity of 0.68 dl/g (measured with a 1% strength solution in dimethylformamide at 25° C.).

EXAMPLES 4 TO 7

The results of four examples are summarized in the following table. The procedures followed in each case were the same as in Examples 1 and 2 except that different recipes were used. Differing properties of the resists which result therefrom are briefly noted in the table. Quantities are given in parts by weight. The binder used in all four examples was 26 parts of the terpolymer described in Example 1. Also, the dyestuffs described in Example 1 were added in the same quantities as in Example 1.

| Example | Low-molecular weight monomer | Quantity | Polyurethane monomer | Quantity | Bis-epoxide | Quantity | 9-Phenyl-acridine | Remarks |
| --- | --- | --- | --- | --- | --- | --- | --- | --- |
| 4 | Bis-urethane dimethacrylate(*) | 18 | same as Example 1 | 3.2 | same as Example 1 | 1.2 | 0.2 | good adhesion to metal |
| 5 | Polypropylene glycol dimethacrylate | 14 | same as Example 1 | 3,2 | same as Example 1 | 1.2 | 0.2 | comparable to Example 1 high light sensitivity |

| Example | Low-molecular weight monomer | Quantity | Polyurethane monomer | Quantity | Bis-epoxide | Quantity | 9-Phenyl-acridine | Remarks |
|---|---|---|---|---|---|---|---|---|
| 6 | Polyethylene glycol 400 dimethacrylate | 12.8 | same as Example 1 | 3.2 | (**) | 1.5 | 0.2 | flexible resist layer orange peel effect |
| 7 | Polyethylene glycol 400 dimethacrylate | 12.8 | same as Example 1 | 3.2 | same as Example 1 | 1.2 | 0.1 | long shelf life, slightly lower light sensitivity |

(*)Prepared from 1 mole of 2,2,4-trimethylhexamethylene diisocyanate and 2 moles of beta-hydroxyethylmethacrylate
(**)Reaction product of bisphenol A and epichlorohydrin having an epoxy equivalent weight of 450

The foregoing description has been set forth merely to illustrate the invention and is not intended to be limiting. Since modifications of the disclosed embodiments incorporating the spirit and substance of the invention may occur to persons skilled in the art, the scope of the invention is to be limited solely with respect to the appended claims and equivalents.

We claim:

1. A radiation-polymerizable mixture comprising:
   (a) a compound which has at least two terminal ethylenically unsaturated groups and which can form a crosslinked polymer by means of free radical initiated chain addition polymerization,
   (b) a polymeric binder insoluble in water and soluble in aqueous-alkaline solutions,
   (c) a radiation-activatable polymerization initiator,
   and
   (d) a compound having two epoxy groups in the molecule and a molecular weight of not more than 1,500.

2. A radiation-polymerizable mixture according to claim 1 comprising from 1.5 to 10 weight percent of said epoxy group containing compound.

3. A radiation-polymerizable mixture according to claim 1, wherein said compound having two epoxy groups is a bis-glycidyl ether of a dihydric alcohol or phenol.

4. A radiation-polymerizable mixture according to claim 3, wherein said compound having two epoxy groups corresponds to the general formula

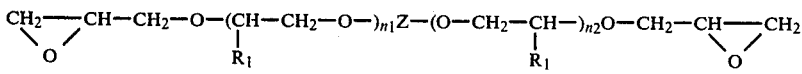

wherein:

Z represents an alkylene or hydroxyalkylene group having 2 to 6 carbon atoms or a group corresponding to the formula

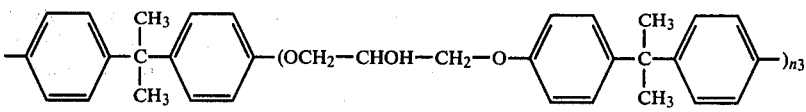

$R_1$ represents a hydrogen atom or a methyl group,
$n_1$ and $n_2$ represent a number from 0 to 10 and
$n_3$ represents a number from 0 to 4.

5. A radiation-polymerizable mixture according to claim 1, wherein the unsaturated groups of said polymerizable compound comprise acrylate or methacrylate groups.

6. A radiation-polymerizable mixture according to claim 5, wherein said polymerizable compound comprises a mixture of an acrylate or methacrylate of a primary alcohol having at least two hydroxyl groups and a polyurethane corresponding to the general formula

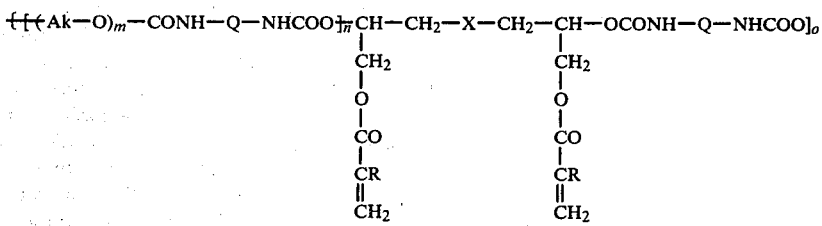

wherein
Q represents a bivalent mononuclear or binuclear aromatic radical which is unsubstituted or substituted by lower alkyl groups and which can contain a lower alkylene group as a connecting member,
X represents one of the groups —O—Ph—X′—Ph—O— and —OOC—(CH$_2$)$_y$—COO—, wherein
Ph represents a substituted or unsubstituted phenylene group,
X′ represents an alkylene group having from 1 to 4 carbon atoms, and
y is a number from 2 to 12, R represents a hydrogen atom or a methyl group,
Ak represents an alkylene radical having from 2 to 4 carbon atoms,
m represents a number from 4 to 50,
n represents a number from 1 to 6, and
o represents a number from 4 to 20.

7. A radiation-polymerizable mixture according to claim 1, further comprising at least two dyestuffs, one of said dyestuffs changing its color on irradiation and being destroyed with loss of color at temperatures above 200° C.; and another of said dyestuffs being stable on irradiation and at temperatures above 200° C.

8. A radiation-polymerizable mixture according to claim 2, comprising from 2 to 6 weight percent of said epoxy group containing compounds.

9. A radiation-polymerizable mixture according to claim 3, wherein said compound having two epoxy groups is a bis-glycidyl ether of a compound selected from the group consisting of bisphenol A, polyethylene glycol ethers of bisphenol A, polypropylene glycol ethers of bisphenol A, butane-1,4-diol, hexane-1,6-diol, polyethylene glycol, polypropylene glycol, polytetrahydrofuran, and glycerol.

10. A radiation-polymerizable mixture according to claim 4, wherein $n_1$ and $n_2$ each represent a number from 0 to 5 and $n_3$ represents 0 or 1.

11. A radiation-polymerizable mixture according to claim 5, wherein said unsaturated group containing compound comprises an ester of acrylic acid or methacrylic acid with an alcohol containing from 2 to 4 hydroxyl groups.

12. A radiation-polymerizable mixture according to claim 11, wherein said alcohol is selected from the group consisting of ethylene glycol, propylene glycol, butane-1,4-diol, butane-1,3-diol, diethylene glycol, triethylene glycol, polyethylene glycols having molecular weights from about 200 to 1,000, neopentyl glycol, trimethylolethane, trimethylolpropane, pentaerythritol, and bisphenol A bis-hydroxyethyl ether.

13. A radiation-polymerizable mixture according to claim 5, wherein said unsaturated group containing compound comprises a urethane group containing reaction product obtained by reacting two moles of a hydroxyalkylacrylate or hydroxyalkylmethacrylate with one mole of an aliphatic or cycloaliphatic diisocyanate.

14. A radiation-polymerizable mixture according to claim 6, wherein said polyurethane has a reduced specific viscosity of from 0.15 to 1.4 dl/g. measured with a 1 percent strength solution in dimethylformamide at 25° C.

15. A radiation-polymerizable mixture according to claim 6, wherein m is from 8 to 20, n is from 2 to 4, o is from 5 to 12 and y is from 2 to 6.

16. A radiation-polymerizable mixture according to claim 6, wherein X' represents an alkylene group in which the free valencies are located on one carbon atom.

17. A radiation-polymerizable mixture according to claim 6 comprising from 2 to 20 weight percent of said polyurethane.

18. A radiation-polymerizable mixture according to claim 17 comprising from 5 to 10 weight percent of said polyurethane.

19. A radiation-polymerizable mixture according to claim 1 comprising from 20 to 50 weight percent of said polymerizable compound, from 40 to 80 weight percent of said polymeric binder and from 0.01 to 10 weight percent of said radiation-activatable polymerization initiator.

20. A radiation-polymerizable mixture according to claim 19 comprising from 25 to 45 weight percent of said polymerizable compound, from 50 to 70 weight percent of said polymeric binder and from 0.05 to 2 weight percent of said radiation-activatable polymerization initiator.

21. A radiation-polymerizable mixture according to claim 1, wherein said polymerization initiator is selected from the group consisting of acridine derivatives, phenazine derivatives, quinoxaline derivatives, and quinazoline derivatives.

22. A radiation-polymerizable mixture according to claim 21, wherein said polymerization initiator is selected from the group consisting of 9-phenylacridine, 9-p-methoxyphenylacridine, 9-acetylaminoacridine, benzo(a)acridine, 9,10-dimethylbenzo(a)phenazine, 9-methylbenzo(a)phenazine, 10-methoxybenzo(a)phenazine, 6,4',4''-trimethoxy-2,3-diphenylquinoxaline and 4',4''-dimethoxy-2,3-diphenyl-5-azaquinoxaline.

23. A radiation-polymerizable mixture according to claim 7, wherein said dyestuff which changes color on irradiation and is destroyed at temperatures above 200° C. is selected from the group consisting of triphenylmethane dyestuffs and azo dyestuffs.

24. A radiation-polymerizable mixture according to claim 7, wherein said radiation and heat stable dyestuff is selected from the group consisting of oxazolone dyestuffs and anthraquinone dyestuffs.

25. A radiation-polymerizable mixture according to claim 24, wherein said stable dyestuff is selected from the group consisting of 1,4-bis-(4-tert.-butoxyphenylamino)-5,8-dihydroxy anthraquinone and oxazolone dyestuffs corresponding to the formula

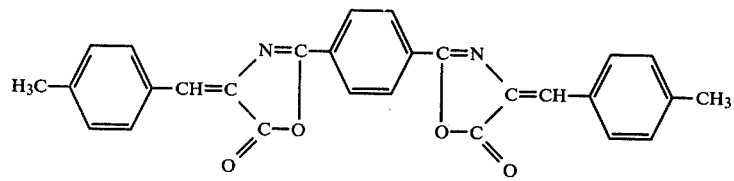

26. A photopolymerizable copying material comprising a flexible transparent temporary support and a transferrable thermoplastic photopolymerizable layer; said photopolymerizable layer comprising:
(a) a compound having at least two terminal ethylenically unsaturated groups which can form a crosslinked polymer by free radical initiated chain addition polymerization;
(b) a polymeric binder insoluble in water and soluble in aqueous-alkaline solutions;
(c) a photopolymerizable initiator; and (d) a compound having two epoxy groups in the molecule and a molecular weight of not more than 1,500.

27. A photopolymerizable copying material according to claim 26, wherein said photopolymerizable layer has a thickness from 10 to 150 μm.

28. A photopolymerizable copying material according to claim 27, wherein said photopolymerizable layer has a thickness from 20 to 120 μm.

29. A photopolymerizable copying material according to claim 26, wherein said support comprises a polyester film.

30. A photopolymerizable copying material according to claim 26, further comprising a covering film over said photopolymerizable layer.

31. A photopolymerizable copying material according to claim 30, wherein said covering film is selected from the group consisting of polyethylene films and polypropylene films.

* * * * *